US010599581B2

(12) United States Patent
Kim

(10) Patent No.: US 10,599,581 B2
(45) Date of Patent: Mar. 24, 2020

(54) DATA STORAGE DEVICE AND OPERATING METHOD THEREOF

(71) Applicant: SK hynix Inc., Gyeonggi-do (KR)

(72) Inventor: Jee Yul Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 14 days.

(21) Appl. No.: 16/116,394

(22) Filed: Aug. 29, 2018

(65) Prior Publication Data

US 2019/0243775 A1 Aug. 8, 2019

(30) Foreign Application Priority Data

Feb. 7, 2018 (KR) .................. 10-2018-0015283

(51) Int. Cl.
| | |
|---|---|
| G11C 29/00 | (2006.01) |
| G06F 12/10 | (2016.01) |
| G06F 11/10 | (2006.01) |
| G11C 29/52 | (2006.01) |
| G11C 8/06 | (2006.01) |
| G11C 29/04 | (2006.01) |

(52) U.S. Cl.
CPC .......... *G06F 12/10* (2013.01); *G06F 11/1068* (2013.01); *G11C 8/06* (2013.01); *G11C 29/52* (2013.01); *G06F 2212/1044* (2013.01); *G06F 2212/657* (2013.01); *G11C 2029/0411* (2013.01)

(58) Field of Classification Search
CPC ......... G06F 12/10; G06F 11/1068; G06F 8/06
See application file for complete search history.

(56) References Cited

U.S. PATENT DOCUMENTS

| | | | | |
|---|---|---|---|---|
| 8,027,194 B2* | 9/2011 | Lee | ...................... | G11C 11/5628 365/185.03 |
| 9,013,921 B2* | 4/2015 | Miyamoto | .............. | G11C 16/26 365/185.09 |
| 9,063,857 B2* | 6/2015 | Kim | ..................... | G06F 11/1012 |
| 9,417,960 B2* | 8/2016 | Cai | .......... | G11C 5/147 |
| 9,489,263 B2* | 11/2016 | Hyun | ..................... | G11C 29/52 |
| 9,647,695 B2* | 5/2017 | Kim | ..................... | G06F 11/1048 |
| 9,785,572 B1* | 10/2017 | Lercari | .................. | G06F 3/064 |
| 10,048,878 B2* | 8/2018 | Nam | ...................... | G06F 3/0688 |
| 10,353,769 B2* | 7/2019 | Srinivasan | .............. | G06F 11/08 |

FOREIGN PATENT DOCUMENTS

KR 1020120135216 12/2012

* cited by examiner

*Primary Examiner* — Esaw T Abraham
(74) *Attorney, Agent, or Firm* — IP & T Group LLP

(57) ABSTRACT

A data storage device includes a nonvolatile memory device including an address map table in which a plurality of map segments including a plurality of logical-to-physical (P2L) entries are stored and a controller controlling the nonvolatile memory device. The controller includes a processor and a memory storing a map update module configured to be driven through the processor and perform map updating on the plurality of map segments. The map update module divides each of the map segments into a plurality of sub segments, updates a first sub segment as an updating target among the plurality of sub segments by loading the first sub segment into a map update buffer of the memory, and encodes second sub segments as a non-updating target among the plurality of sub segments and stores the encoded second sub segments in a page buffer of the nonvolatile memory device.

20 Claims, 16 Drawing Sheets

FIG.3A

AMT

| L2 Segment | Logical Address | Physical Address |
|---|---|---|
| S1 | LBA1 | PBA1 |
| | LBA2 | PBA2 |
| | ⋮ | ⋮ |
| | LBAm | PBAm |
| ⋮ | ⋮ | ⋮ |
| Sn | LBA1 | PBA1 |
| | LBA2 | PBA2 |
| | ⋮ | ⋮ |
| | LBAm | PBAm |

L2P entry

FIG.3B

| L2 Segment | Logical Address (LBA1~LBAm) | | | |
|---|---|---|---|---|
| S1 | LBA1~LBAk | LBAk+1~LBA2k | LBA2k+1~LBA3k | LBA3k+1~LBAm |
| | ↑ SS1 | ↑ SS2 | ↑ SS3 | ↑ SS4 |

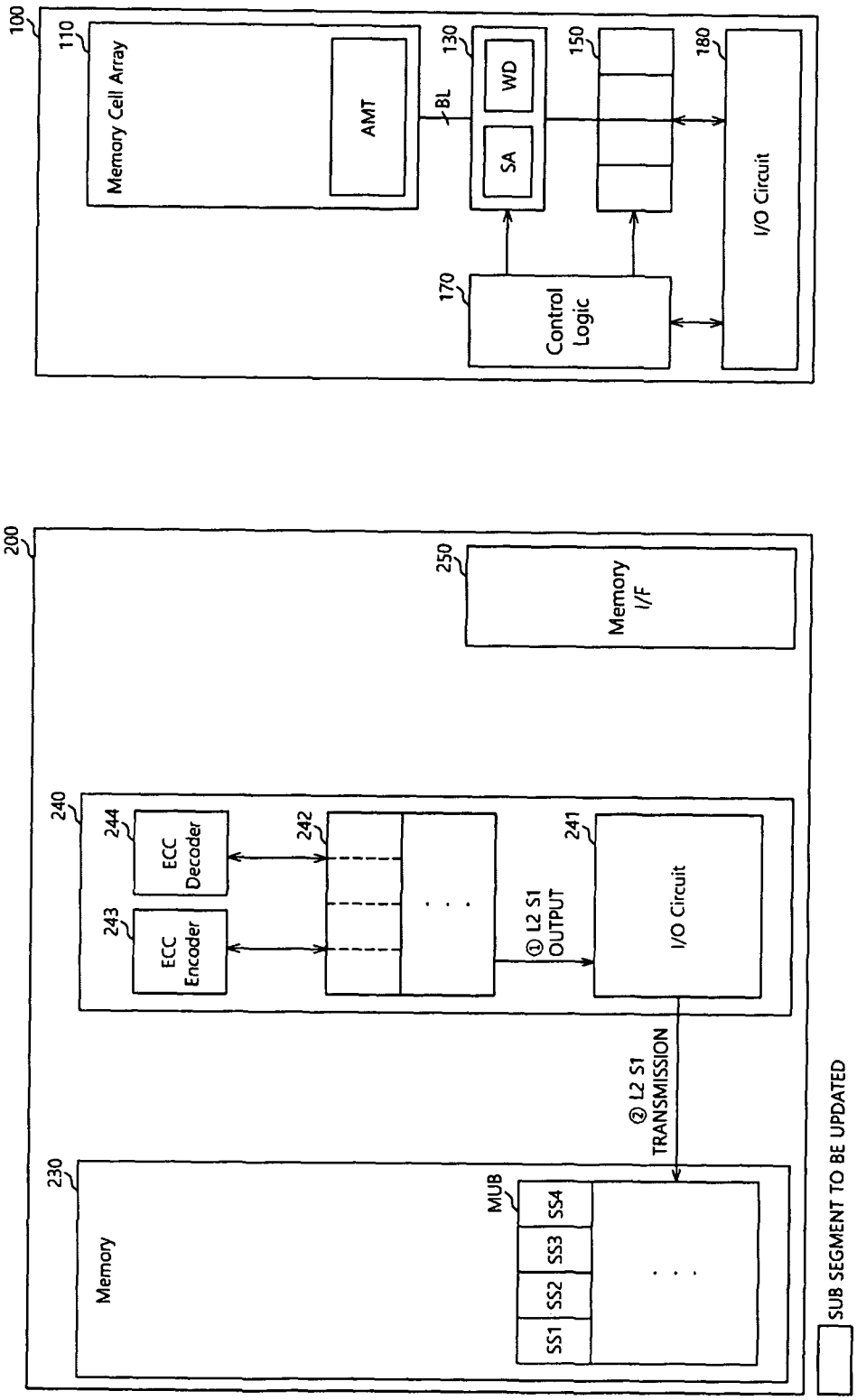

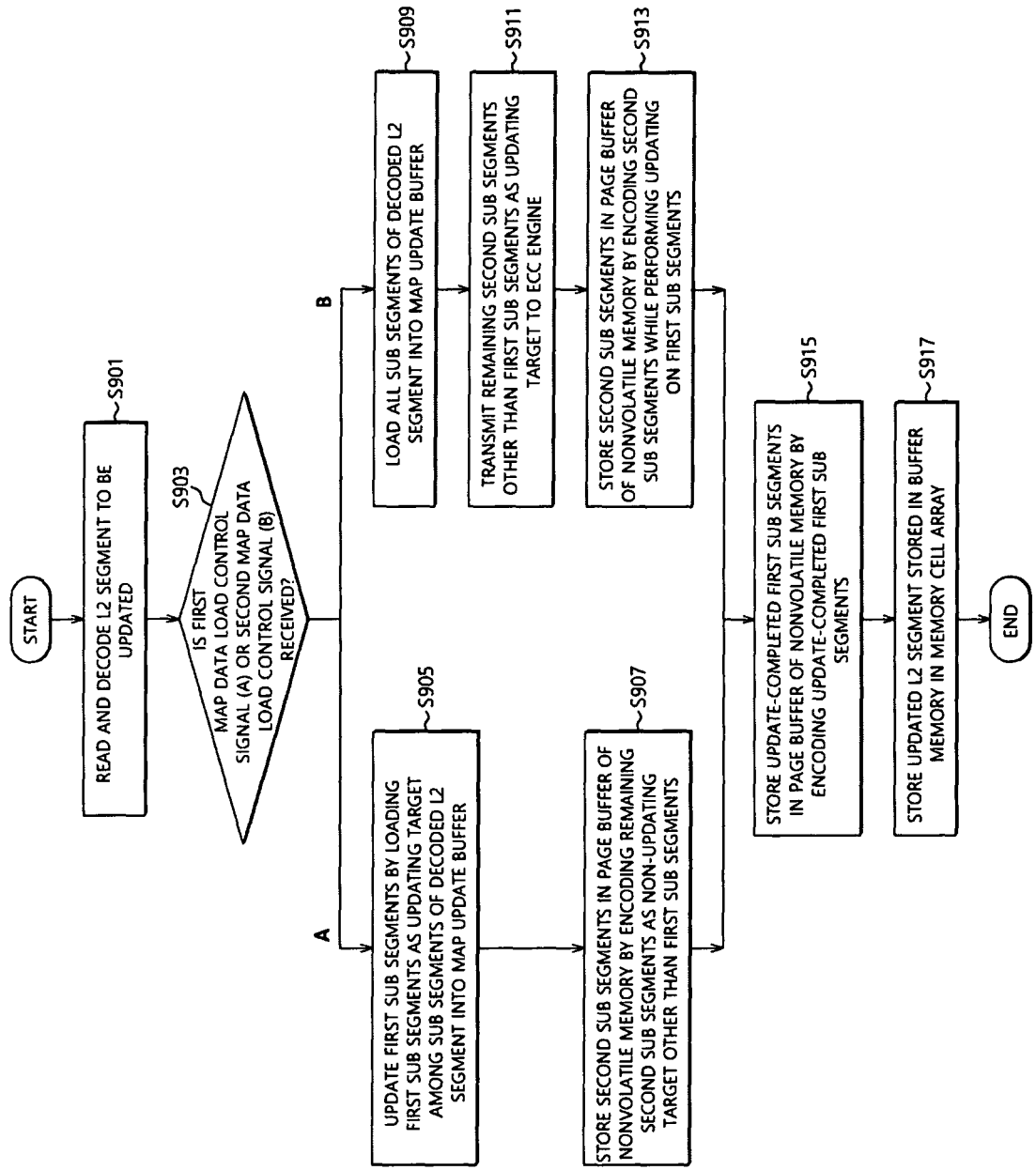

DATA STORAGE DEVICE AND OPERATING METHOD THEREOF

CROSS-REFERENCES TO RELATED APPLICATION

The present application claims priority under 35 U.S.C. § 119(a) to Korean patent application number 10-2018-0015283, filed on Feb. 7, 2018, in the Korean Intellectual Property Office, which is incorporated herein by reference in its entirety.

BACKGROUND

1. Technical Field

Various embodiments of the present invention relate to a data storage device and an operating method thereof.

2. Related Art

The computing environment paradigm has been shifting to ubiquitous computing, which enables computer systems to be used anytime and anywhere. As a result, use of portable electronic apparatuses such as mobile phones, digital cameras, and laptop computers has increased rapidly. Generally, portable electronic apparatuses use data storage devices that employ memory devices. Data storage devices may be used to store data used in the portable electronic apparatuses.

Since they have no mechanical driving units, data storage devices that employ memory devices have advantages such as excellent stability and endurance, high information access rate, and low power consumption. Such data storage devices may include a universal serial bus (USB) memory device, a memory card having various interfaces, a universal flash storage (UFS) device, a solid state drive (SSD), and the like.

SUMMARY

Embodiments are provided to a data storage device capable of efficiently using a map update buffer having a limited size and an operating method thereof.

Embodiments are provided to a data storage device with an improved map update rate and an operating method thereof.

In an embodiment of the present disclosure, a data storage device may include: a nonvolatile memory device including an address map table in which a plurality of map segments including a plurality of logical-to-physical (L2P) entries are stored; and a controller configured to control the nonvolatile memory device. The controller may include a processor configured to control an overall operation of the data storage device; and a memory configured to store a map update module configured to be driven through the processor and perform map updating on the plurality of map segments. The map update module may divide each of the map segments into a plurality of sub segments, update a first sub segment as an updating target among the plurality of sub segments by loading the first sub segment into a map update buffer of the memory, and encodes second sub segments as a non-updating target among the plurality of sub segments and store the encoded second sub segments in a page buffer of the nonvolatile memory device.

In an embodiment of the present disclosure, an operating method of a data storage device, the method may include: decoding a map segment to be updated by reading the map segment to be updated among a plurality of map segments from a nonvolatile memory device; performing updating on a first sub segment as an updating target among a plurality of sub segments included in the decoded map segment to be updated; and encoding second sub segments as a non-updating target among the plurality of sub segments and storing the encoded second sub segments in a page buffer of the nonvolatile memory device.

In an embodiment of the present disclosure, a data storage device may include: a nonvolatile memory device including an address map table storing a plurality of map segments, each of the map segments including a plurality of map entries; and a controller including a processor and a map update module configured to be driven by the processor. The map update module may determines whether at least one map entry among the plurality of map entries is required to update; when it is determined that the at least one map entry is required to update, update a target sub segment included in a target segment among the plurality of map segments, each of the map segments including a plurality of sub segments, each of the sub segments including multiple map entries, the target sub segment among the plurality of sub segments and the target segment including the at least one map entry; encode remaining sub segments included in the target segment excluding the target sub segment; and store the updated target sub segment and the encoded remaining segments in the nonvolatile memory device.

According to embodiments, as a size of map data loaded into a map update buffer is reduced, the map update buffer having a limited size may be efficiently used.

The map updating and map data transfer may be performed in parallel and thus a time required for a map updating operation may be reduced.

These and other features, aspects, and embodiments are described below in the section entitled "DETAILED DESCRIPTION".

BRIEF DESCRIPTION OF THE DRAWINGS

The above and other aspects, features and advantages of the present invention will be more clearly understood from the following detailed description taken in conjunction with the accompanying drawings, in which:

FIG. 3A is a diagram illustrating an address map table according to an embodiment of the present disclosure.

FIG. 3B is a diagram illustrating an L2 segment according to an embodiment of the present disclosure.

FIGS. 8A to 8C are diagrams illustrating a process of a map updating operation according to an embodiment of the present disclosure.

FIG. 9 is a flowchart illustrating an operation of a data storage device according to an embodiment of the present disclosure.

DETAILED DESCRIPTION

Figure 1:
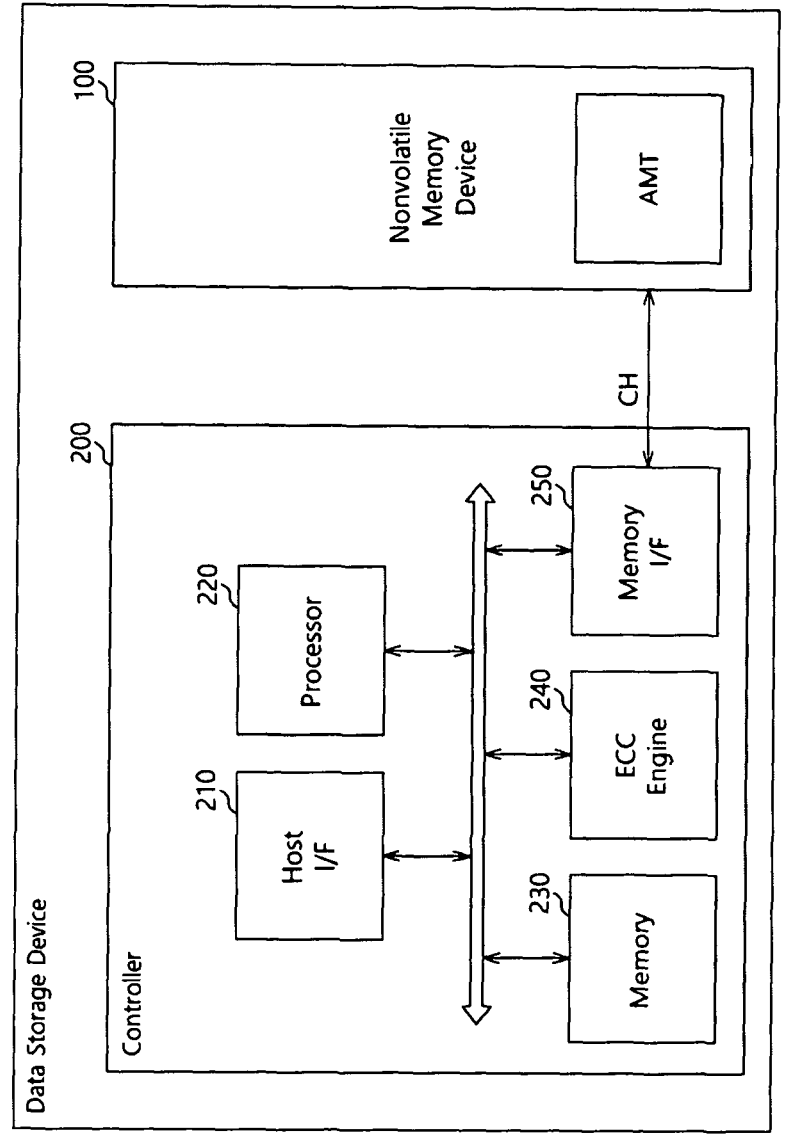
FIG. 1 is a block diagram illustrating a data storage device according to an embodiment of the present disclosure.

Various embodiments of the present invention will be described in more detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 2:
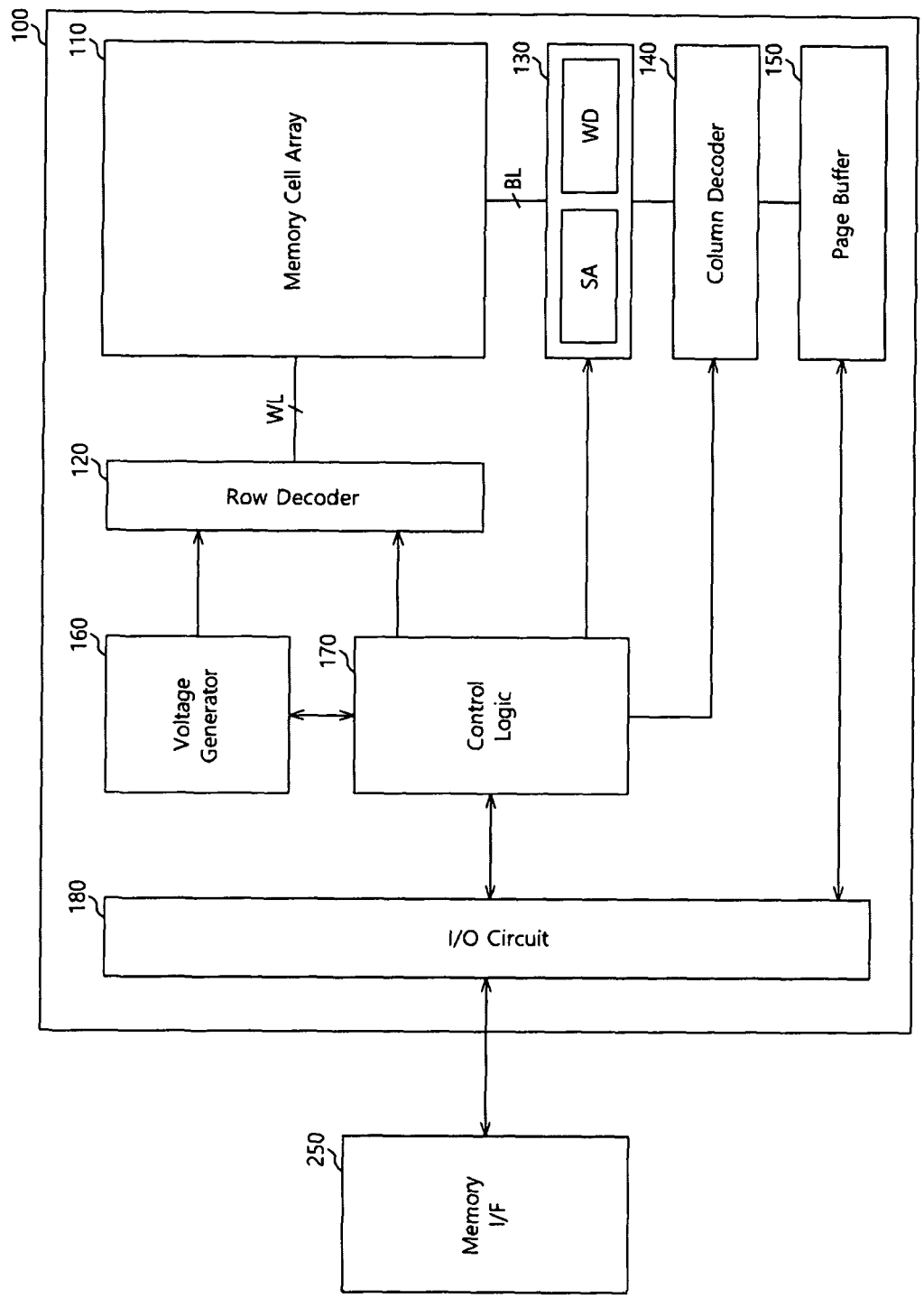
FIG. 2 is a diagram illustrating a nonvolatile memory device according to an embodiment of the present disclosure.

FIG. 1 is a block diagram illustrating a configuration example of a data storage device 10 according to an embodiment. FIG. 2 is a diagram illustrating a nonvolatile memory device according to an embodiment, for example, a nonvolatile memory device 100 of FIG. 1.

The data storage device 10 may store data to be accessed by a host device (not shown) such as a mobile phone, an MP3 player, a laptop computer, a desktop computer, a game player, a television (TV), or an in-vehicle infotainment system, and the like. The data storage device 10 may refer to a memory system.

The data storage device 10 may be implemented as any one among various types of storage devices according to a host interface which refers to a transfer protocol with a host device. For example, the data storage device 10 may be implemented by any one of various types of storage devices, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) card type storage device, a compact flash (CF) card, a smart media card, a memory stick, and the like.

The data storage device 10 may be manufactured as any one among various types of packages. For example, the data storage device 10 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

Referring to FIG. 1, the data storage device 10 may include a nonvolatile memory device 100 and a controller 200.

The controller 200 may include a host interface (I/F) 210, a processor 220, a memory 230, an error correction code (ECC) engine 240, and a memory interface (I/F) 250.

The host interface 210 may perform interfacing between a host device (not shown) and the data storage device 10. For example, the host interface 210 may communicate with the host device through any one among standard transfer protocols such as a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-e protocol.

The processor 220 may be implemented by one of a micro control unit (MCU) and a central processing unit (CPU). The processor 220 may process a request received from a host device. To process the request received from the host device, the processor 220 may drive a code-type instruction or algorithm (for example, software) loaded into the memory 230 and control internal function blocks and the nonvolatile memory device 100.

The memory 230 may be implemented by a random access memory such as a dynamic RAM (DRAM) or a static RAM (SRAM). The memory 230 may store software driven through the processor 220. The memory 230 may store data (for example, meta data) required for driving of the software. For example, the memory 230 may operate as a working memory of the processor 220. The memory 230 may temporarily store data to be transmitted from a host device to the nonvolatile memory device 100 or data to be transmitted from the nonvolatile memory device 100 to the host device. For example, the memory 230 may operate as a data buffer memory or a data cache memory.

The nonvolatile memory device 100 may operate as a storage medium of the data storage device 10. Non-limiting examples of the nonvolatile memory device 100 may include any one of various types of nonvolatile memory devices according to a memory cell, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (ReRAM or RRAM) using a transition metal compound.

Referring to FIG. 2, the nonvolatile memory device 100 may include a memory cell array 110, a row decoder 120, a data read and write (read/write) circuit 130, a column decoder 140, a page buffer 150, a voltage generator 160, a control logic 170, and an input and output (I/O) circuit 180.

The memory cell array 110 may include a plurality of memory cells (not shown) arranged in regions in which a plurality of word lines WL and a plurality of bit lines BL cross each other. The memory cell array 110 may include a plurality of memory blocks and each of the plurality of memory blocks may include a plurality of pages.

For example, each of the memory cells in the memory cell array 110 may be at least one among a single level cell (SLC) in which a single bit data (for example, 1-bit data) is to be stored, a multilevel cell (MLC) in which 2-bit data is to be stored, a triple level cell (TLC) in which 3-bit data is to be stored, and a quad level cell (QLC) in which 4-bit data is to be stored. The memory cell array 110 may include at least one or more cells among the SLC, the MLC, the TLC, and the QLC. For example, the memory cell array may include memory cells having a two-dimensional (2D) structure or memory cells having a three-dimensional (3D) structure.

The row decoder 120 may be coupled to the memory cell array 110 through the word lines WL. The row decoder 120 operate under the control of the control logic 170. The row decoder 120 may decode a row address provided from an external apparatus, for example, a memory interface 250 of the controller 200 of FIG. 1 and select and drive the word lines WL based on a decoding result. The row decoder 120 may provide a word line voltage provided from the voltage generator 160 to the selected word line WL.

The data read/write circuit 130 may be coupled to the memory cell array 110 through the bit lines BL. The data read/write circuit 130 may include read/write circuits (not shown) corresponding to the bit lines BL. The data read/write circuit 130 may operate under the control of the control logic 170. The data read/write circuit 130 may operate as a write driver (WD) or a sense amplifier (SA) according to an operation mode. In a write operation, the data read/write circuit 130 may operate as the write driver which stores data provided from the external apparatus in the memory cell array 110. In a read operation, the data read/write circuit 130 may operate as the sense amplifier which reads out data from the memory cell array 110.

The column decoder 140 may operate under the control of the control logic 170. The column decoder 140 may decode a column address provided from the memory interface 250 of the controller 200. The column decoder 140 may couple the read/write circuits of the data read/write circuit 130 corresponding to the bit lines BL and the page buffer 150 according to the decoding result.

The page buffer 150 may temporarily store write data which is received from the memory interface 250 of the controller 200 through the I/O circuit 180 and is to be stored in the memory cell array 110 or read data which is read out from the memory cell array 110 and is to be transmitted to the memory interface 250 of the controller 200 through the I/O circuit 180. The page buffer 150 may operate under the control of the control logic 170.

The voltage generator 160 may generate voltages used for an internal operation of the nonvolatile memory device 100. The voltages generated through the voltage generator 160 may be applied to the memory cells of the memory cell array 110. A write voltage generated in the write operation may be applied to a word line WL of memory cells on which the write operation is to be performed. An erase voltage generated in an erase operation may be applied to well regions of memory cells on which the erase operation is to be performed. A read voltage generated in the read operation may be applied to a word line WL of memory cells on which the read operation is to be performed.

The control logic 170 may control an overall operation of the nonvolatile memory device 100 based on control signals received from the memory interface 250 of the controller 200 through the I/O circuit 180. For example, the control logic 170 may control the read operation, the write operation, and the erase operation of the nonvolatile memory device 100 according to a read command, a write command, and an erase command received from the memory interface 250.

The I/O circuit 180 may be configured to receive the command, address, data from the memory interface 250 of the controller 200 or provide data read out from the memory cell array 110, status information according to operation execution, and the like to the memory interface 250 of the controller 200. The I/O circuit 180 may output the command and address received from the memory interface 250 to the control logic 170 and output data received from the memory interface 250 to the page buffer 150. The I/O circuit 180 may operate under the control logic 170. Although only one I/O circuit 180 is illustrated in FIG. 2 as an example, a data I/O circuit which data is input/output therethrough and an I/O circuit which a command, an address, status information, and the like are input/output therethrough may be separately provided from each other.

Referring again to FIG. 1, an address map table AMT may be stored in the nonvolatile memory device 100. The address map table AMT may store mapping information between a logical block address (hereinafter, referred to as logical address) LBA received from a host device and a physical block address (hereinafter, referred to as physical address) PBA corresponding to the logical address LBA.

FIG. 3A is a diagram illustrating an example of an address map table AMT according to an embodiment and FIG. 3B is a diagram illustrating an example of one L2 segment according to an embodiment.

Referring to FIG. 3A, the address map table AMT may include a plurality of map segments S1 to Sn. Each of the map segments S1 to Sn may include a plurality of logical addresses LBA1 to LBAm and a plurality of physical addresses PBA1 to PBAm corresponding to the plurality of logical addresses LBA1 to LBAm. When the mapping information between one logical address LBA and one physical address PBA refers to a logical to physical (L2P) entry, each of the map segments S1 to Sn may include m L2P entries. The map segment including the plurality of L2P entries may refer to an L2 segment. Hereinafter, for clarity, the map segment refers to the L2 segment.

Referring to FIG. 3B, each of the L2 segments S1 to Sn may include a plurality of sub segments SS1 to SS4. Although one L2 segment includes four sub segments SS1 to SS4 in FIG. 3B, the number of sub segments included in the L2 segment is not limited thereto. For example, the L2 segment may correspond to a unit of write and the sub segment may correspond to a unit of the ECC processing, but this is not limited thereto. Referring to FIG. 3B, each of the sub segments SS1 to SS4 may include k logical addresses. For example, the sub segment SS1 includes LBA1 to LBAk, the sub segment SS2 includes LBAk+1 to LBA2k, the sub segment SS3 includes LBA2k+1 to LBA3k, and the sub segment SS4 includes LBA3k+1 to LBAm.

Referring again to FIG. 3A, the L2 segments S1 to Sn may be updated at a specific timing. For example, the L2 segments S1 to Sn may be updated when the number of P2L entries reaches a preset threshold value. The number of P2L entries may be stored in an address buffer (see AB of FIG. 4A) in which the P2L entries are to be stored. The timing that the L2 segments S1 to Sn are updated is not limited thereto.

The updating may be performed by loading the L2 segments into a map update buffer (see MUB of FIG. 4A) and changing the physical addresses PBA corresponding to the logical addresses LBA of the L2P entries included in the L2 segments based on the P2L entries stored in the address buffer AB. The loading of the L2 segments into the map update buffer may be performed by reading the L2 segments including the logical addresses LBA of the P2L entries stored in the address buffer AB from the nonvolatile memory device 100. Such a process may refer to the map updating. The map data to be updated may be read from the nonvolatile device 100 in a unit of L2 segment.

Figure 4A:
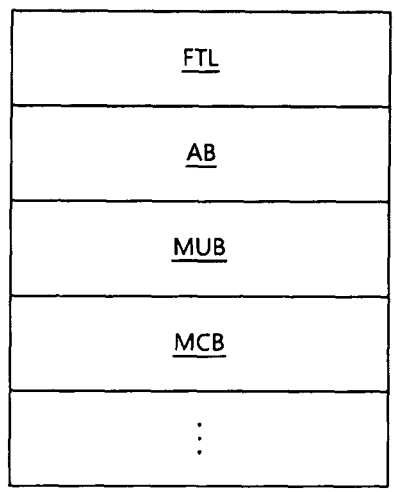
FIG. 4A is a diagram illustrating a memory according to an embodiment of the present disclosure.
Figure 4B:
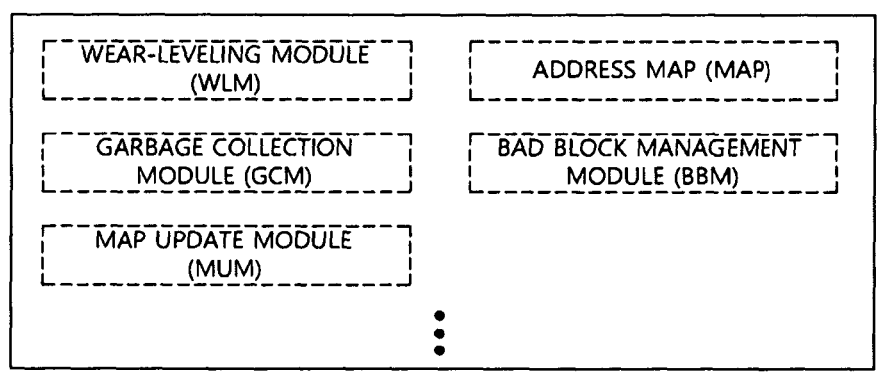
FIG. 4B is a diagram illustrating software stored in a memory and driven through a processor according to an embodiment of the present disclosure.

FIG. 4A is a diagram illustrating a memory according to an embodiment, for example, a memory 230 of FIG. 1. FIG. 4B is a diagram illustrating software stored in a memory and driven through a processor according to an embodiment, for example, an example of software stored in the memory 230 and driven through the processor 220 of FIG. 1.

Referring to FIG. 4A, the Memory 230 may include a flash translation layer (FTL) region into which a flash translation layer FTL is loaded, an address buffer AB, a map update buffer MUB, a map cache buffer MCB, and the like.

When the nonvolatile memory device 100 is implemented by a flash memory device, the processor 220 may control an intrinsic operation of the nonvolatile memory device 100 and drive software (i.e. the flash translation layer FTL) to provide device compatibility to a host device. Through the driving of the flash translation layer FTL, the host device may recognize and use the data storage device 10 as a general data storage device such as a hard disk drive. The flash translation layer FTL loaded into the FTL region of the memory 230 may be configured of modules configured to perform various functions and meta data required for driving of the modules. The flash translation layer FTL may be stored in a system region (not shown) of the nonvolatile memory device 100 and may be loaded into the memory 230 when the data storage device 10 is powered on.

Referring to FIG. 4B, the flash translation layer FTL may include a wear-leveling module WLM, a bad block management module BBM, a garbage collection module GCM, an address map MAP, a map update module MUM, and the like. However, the configuration of the flash translation layer FTL is not limited thereto.

The wear-leveling module WLM may manage wear-levels of memory blocks of the nonvolatile memory device 100. The memory cells of the nonvolatile memory device 100 may be worn out through repetition of an erase operation and a write operation. The worn-out memory cells may cause defects (for example, physical defects). The wear-leveling module WLM may manage the erase/write (E/W) cycles of the memory blocks to be leveled so as to prevent a specific memory block from being worn out faster than other memory blocks. For example, the wear-leveling module WLM may manage the worn-out degrees of all the memory blocks included in the nonvolatile memory device 100 to be maintained to similar levels.

The bad block management module BBM may mange defective memory blocks among the memory blocks in the nonvolatile memory device 100. As described above, defects (for example, physical defects) may occur in the worn-out memory cells. Data stored in the defective memory cells may not be normally read out. Data may not be normally stored in the defective memory cells. The bad block management module BBM may manage memory blocks including the defective memory cells so as not to be used.

The garbage collection module GCM may collect all valid stored data that is dispersed in the memory blocks of the nonvolatile memory device 100 to one memory block and manage the nonvolatile memory device 100 to perform an erase operation on the invalid data.

The nonvolatile memory device 100 implemented by a flash memory device may not support data overwrite due to a structural feature. When data is written in a programmed memory cell, the reliability of the data stored in the corresponding memory cell may not be guaranteed. Accordingly, in order to write the data in the programmed memory cell, an erase operation may be performed on the programmed memory cell.

Since the erase operation on the nonvolatile memory device 100 is performed in a unit of memory block, the considerably long time for the erase operation may be required. Accordingly, when a memory cell corresponding to an address to be written is programmed, the processor 220 may not program the data in the corresponding memory cell after erase of the corresponding memory cell. Instead, the processor 220 may program the data in another memory cell which has been already in an erase state. The data stored in an original memory cell to be written may be invalid data and the data stored in the other memory cell may be valid data.

Through such an operation of the processor 220, the valid data and invalid data may be mixed in the nonvolatile memory device 100. If necessary, the processor 220 may perform a series of operations which collect the dispersed valid data in one site, for example, one memory block and erase the invalid data by driving the garbage collection module GCM. The series of operations may refer to a garbage collection operation.

The address map MAP may store address mapping information for an address translation operation. When a host device accesses the data storage device 10, for example, when the host device provides a read request or a write request, the host device may provide a logical address LBA to the data storage device 10. The flash translation layer FTL may translate the provided logical address LBA to an actual address of the nonvolatile memory device 100, for example, a physical address PBA and perform the read operation or the write operation on the memory cells corresponding to the translated physical address.

The map update module MUM may manage the L2 segments S1 to Sn of the address map table AMT stored in the nonvolatile memory device 100. A host device may provide a logical address LBA to be written to the data storage device 10 when the host device provide the write request to the data storage device 10. The logical address LBA to be written received from the host device may be mapped with a specific physical address PBA within the address buffer AB and stored. The map update module MUM may manage the L2P entries of the L2 segments to be updated when the number of the P2L entries stored in the address buffer AB reaches the preset threshold value. The L2 segments may include the logical addresses LBA of the P2L entries.

The map update module MUM may generate a map read control signal which instructs the L2 segment to be updated among the L2 segments to be read from the nonvolatile memory device 100. The L2 segments are stored in the address map table AMT of the nonvolatile memory device 100. The map update module MUM may provide the generated map read control signal to the memory interface 250. The memory interface 250 may generate a map read command to be provided to the nonvolatile memory device 100 based on the map read control signal and provide the generated map read command to the nonvolatile memory device 100.

The nonvolatile memory device 100 may read the L2 segment to be updated from the memory cell array 110 and provide the read L2 segment to be updated to the memory interface 250 in response to the map read command. The memory interface 250 may receive the L2 segment to be updated from the nonvolatile memory device 100 and provide the L2 segment to be updated to the ECC engine 240.

The map update module MUM may generate a map data decoding control signal which instructs the decoding processing for the L2 segment to be updated and provide the map data decoding control signal to the ECC engine 240.

The map update module MUM may generate a map data load control signal which instructs the decoded L2 segment to be loaded into the map update buffer MUB and provide the generated map data load control signal to the ECC engine 240. The map data load control signal may include a first map data load control signal and a second map data load control signal. The first map data load control signal may instruct partial sub segments to be updated (hereinafter, referred to as 'first sub segments') having L2P entries among a plurality of sub segments included in the decoded L2 segment to be loaded into the map update buffer MUB. The second map data load control signal may instruct all the plurality of sub segments included in the decoded L2 segment to be loaded into the map update buffer MUB.

The map update module MUM may perform updating on the L2 segment by changing the physical addresses PBA corresponding to the logical addresses LBA of the L2P entries included in all or a portion of the sub segments of the L2 segment loaded into the map update buffer MUB based on the P2L entries stored in the address buffer AB.

The map update module MUM may generate a map data encoding control signal and provide the generated map data encoding control signal to the ECC engine 240. The map data encoding control signal may instruct encoding processing for the updated L2 segment. The map data encoding control signal may include a first map data encoding control signal and a second map data encoding control signal. The first map data encoding control signal may instruct encoding processing for partial sub segments (for example, first sub segments) of the L2 segment. The second map data encoding control signal may instruct encoding processing for the remaining sub segments (for example, sub segments as a non-updating target) (hereinafter, referred to as 'second sub segments') other than the first sub segments in the L2 segment.

The map update module MUM may generate a map data transfer control signal and provide the generated map data transfer control signal to the ECC engine 240. The map data transfer control signal may instruct the encoded L2 segment to be transmitted to the nonvolatile memory device 100. The map data transfer control signal may include a first map data transfer control signal for transmitting the first sub segments of the L2 segment and a second map data transfer control signal for transmitting the second sub segments.

A large number of L2P entries may be included in one L2 segment. In map updating, an operation of loading the map data into the map update buffer MUB by reading the map data from the nonvolatile memory device 100 or an operation of writing the map data in the nonvolatile memory device 100 may be performed in a unit of L2 segment. Accordingly, even when the updating for only few L2P entries of the L2P entries included in one L2 segment is necessary, the map updating may be performed by loading the whole L2 segment into the map update buffer MUB and thus the map update buffer MUB having a limited size may not be efficiently used.

As the size of the nonvolatile memory device 100 is increased, the size of the map data may also be increased and the map data transfer time may be inevitably increased. Accordingly, the time required for the map updating operation may be increased.

In various embodiments, the map update module MUM may divide the L2 segment into the plurality of sub segments by grouping the L2P entries of the L2 segment in a specific unit. The map update module MUM may manage sub segments (for example, first sub segments) to be map-updated by loading the sub segments including the L2P entries as an updating target among the plurality of sub segments into the map update buffer MUB. Simultaneously, the map update module MUM may manage sub segments (for example, second sub segments) including the L2P entries as a non-updating target to be ECC-encoded and then to be transmitted to the nonvolatile memory device 100. The specific unit as the criterion for grouping the L2P entries may be a unit of the ECC processing, but this is not limited thereto.

Accordingly, the size of the map data loaded into the map update buffer MUB may be reduced and thus the map update buffer MUB having the limited size may be efficiently used. The map updating and the map data transfer may be performed in parallel and thus the time required for the map updating may be reduced.

Referring again to FIG. 4A, the address buffer AB may store the mapping information between a logical address LBA to be written which is received from a host device and an actual address of the nonvolatile memory device 100 in which write data is stored (for example, physical address PBA). The address mapping information stored in the address buffer AB may include the P2L entry.

All or a portion of the sub segments of at least one or more L2 segments to be updated among the plurality of L2 segments S1 to Sn stored in the address map table AMT of the nonvolatile memory device 100 may be loaded into the map update buffer MUB. The physical addresses PBA for the L2P entries of the L2 segments loaded into the map update buffer MUB may be changed based on the P2L entries stored in the address buffer AB.

The map cache buffer MCB may cache map data corresponding to a logical address which is recently read-requested from a host device or a logical address which is frequently read-requested from the host device. The map data cached in the map cache buffer MCB may include the L2P segments.

Referring again to FIG. 1, the ECC engine 240 may generate parity data for data to be transmitted to the nonvolatile memory device 100. The generated parity data may be stored in the nonvolatile memory device 100 with the data. The ECC engine 240 may detect an error of the data read out from the nonvolatile memory device 100 based on the parity data and correct the detected error when the detected error is within a correctable range.

Figure 5:
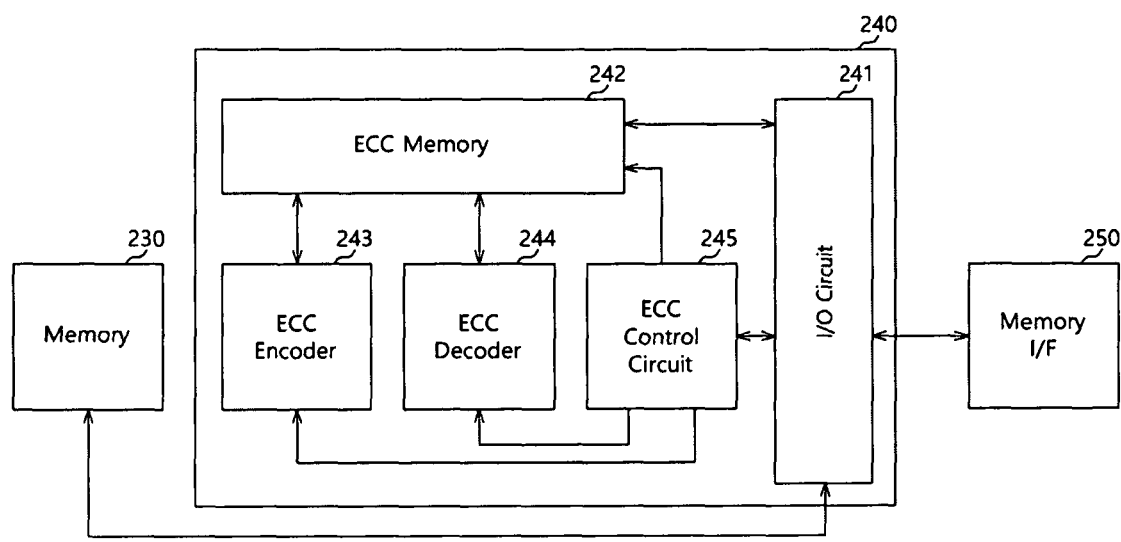
FIG. 5 is a diagram illustrating an error correction code (ECC) engine according to an embodiment of the present disclosure.

FIG. 5 is a diagram illustrating an error correction code (ECC) engine according to an embodiment, for example, the ECC engine 240 of FIG. 1. The configuration of the ECC engine 240 illustrated in FIG. 5 is merely exemplary and the configuration of the ECC engine 240 is not limited thereto.

Referring to FIG. 5, the ECC engine 240 may include an input and output (I/O) circuit 241, an ECC memory 242, an ECC encoder 243, an ECC decoder 244, and an ECC control circuit 245.

The I/O circuit 241 of the ECC engine 240 may be coupled to the memory 230 and the memory interface 250. The I/O circuit 241 may receive data provided from the memory 230 or provide decoded data to the memory 230. The I/O circuit 241 may provide encoded data to the memory interface 250 or receive encoded data provided from the memory interface 250. The I/O circuit 241 may operate under the control of the ECC control circuit 245.

The ECC memory 242 may temporarily store data received from the memory 230 through the I/O circuit 241, encoded data received from the memory interface 250 through the I/O circuit 241, data encoded through the ECC encoder 243, data decoded through the ECC decoder 244, and the like. The I/O circuit 241 may transmit the data received from the memory 230 and the encoded data received from the memory interface 250 to the ECC memory 242 to be stored therein. The I/O circuit 241 may transmit encoded data output from the ECC memory 242 to the memory interface 250 or transmit decoded data output from the ECC memory 242 to the memory 230.

The ECC encoder 243 may encode data received from the memory 230. The ECC encoder 243 may operate under the control of the ECC control circuit 245. The ECC encoder 243 may encode data by fetching the data provided from the memory 230 and stored in the ECC memory 242 and store the encoded data in the ECC memory 242 again, according to control of the ECC control circuit 245.

The ECC decoder 244 may decode encoded data received from the memory interface 250. The ECC decoder 244 may operate under the control of the ECC control circuit 245. The ECC decoder 244 may decode encoded data by fetching the encoded data provided from the memory interface 250 and stored in the ECC memory 242 and store the decoded data in the ECC memory 242, under the control of the ECC control circuit 245.

The ECC control circuit 245 may control an overall operation of the ECC engine 240. The ECC control circuit 245 may control operations of function blocks within the ECC engine 240, for example, the ECC memory 242, the ECC encoder 243, the ECC decoder 244, and the I/O circuit 241 based on operation control signals received from the processor 220 through the I/O circuit 241.

For example, the ECC control circuit 245 may control the operations of the ECC memory 242, the ECC encoder 243, the ECC decoder 244, and the I/O circuit 241 within the ECC engine 240 according to the control signals received from the map update module MUM driven through the processor 220.

As described above, the control signals provided from the map update module MUM to the ECC engine 240 may include the map data decoding control signal, the first and second map data load control signals, the first and second map data encoding control signals, and the first and second map data transfer control signals.

When the map data decoding control signal is received from the map update module MUM driven through the processor 220, the ECC control circuit 245 may control the ECC decoder 244 to perform a decoding operation on the sub segments of the L2 segment to be updated which is provided from the memory interface 250 and stored in the ECC memory 242.

When the first map data load control signal, the second map data encoding control signal, and the second map data transfer control signal are received from the map update module MUM, the ECC control circuit 245 may control the ECC memory 242 to output the first sub segments and control the I/O circuit 241 to transmit the first sub segments output from the ECC memory 242 to the map update buffer MUB. The ECC control circuit 245 may control the ECC encoder 243 to perform an encoding operation on the second sub segments stored in the ECC memory 242 and control the I/O circuit 241 to transmit the encoded second sub segments to the memory interface 250.

When the second map data load control signal is received from the map update module MUM, the ECC control circuit 245 may control the ECC memory 242 to output the first and second sub segments and control the I/O circuit 241 to transmit the first and second sub segments output from the ECC memory 242 to the map update buffer MUB.

When the first map data encoding control signal and the first map data transfer control signal are received from the map update module MUM, the ECC control circuit 245 may control the ECC encoder 243 to perform an encoding operation on the updated first sub segments which are provided from the memory 230 and stored in the ECC memory 242 and control the I/O circuit 241 to transmit the encoded first sub segments to the memory interface 250.

Referring again FIG. 1, the memory interface 250 may control the nonvolatile memory device 100 according to control of the processor 220. The memory interface 250 may refer to a memory controller. The memory interface 250 may provide control signals to the nonvolatile memory device 100. The control signals may include a command, an address, and the like for controlling the nonvolatile memory device 100. The memory interface 250 may provide data to the nonvolatile memory device 100 or receive data from the nonvolatile memory device 100. The memory interface 250 may be coupled to the nonvolatile memory device 100 through a channel CH including one or more signal lines.

The memory interface 250 may generate a map read command (e.g. MRCMD of FIG. 6) to be provided to the nonvolatile memory device 100 based on the map read control signal received from the map update module MUM and provide the map read command to the nonvolatile memory device 100. The memory interface 250 may generate a map write command (e.g. MWCMD of FIG. 7B) to be provided to the nonvolatile memory device 100 based on the map write control signal received from the map update module MUM and provide the map write command to the nonvolatile memory device 100.

Figure 6:
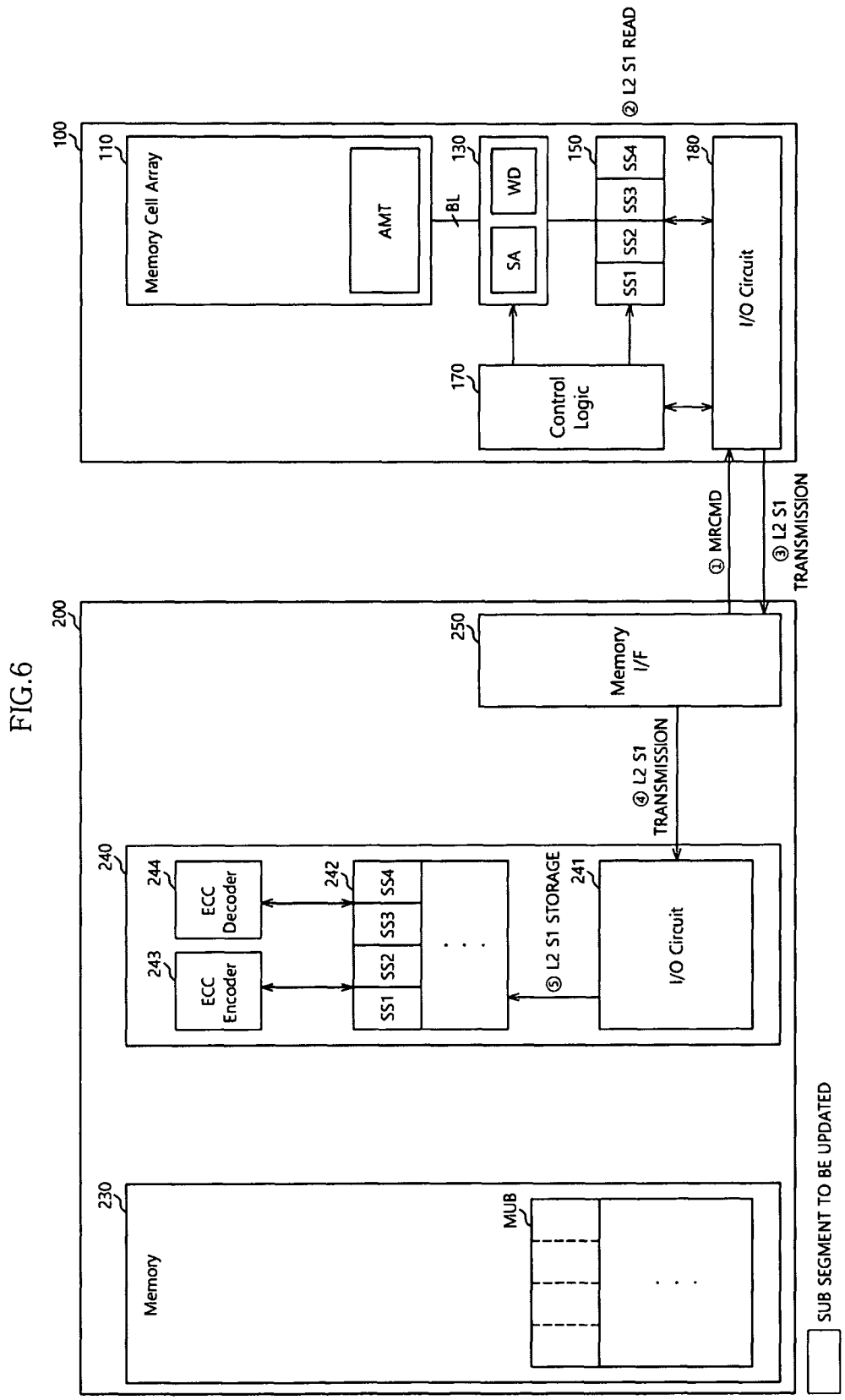
FIG. 6 is a diagram illustrating an operation of storing an L2 segment to be updated in an ECC memory within an ECC engine according to an embodiment of the present disclosure.

FIG. 6 is a diagram illustrating an operation of reading an L2 segment to be updated from a nonvolatile memory device and storing the read L2 segment to be updated in an ECC memory. For example, FIG. 6 illustrates an operation of reading the L2 segment to be updated from the nonvolatile memory device 100 and storing the read L2 segment to be updated in the ECC memory 242 of the ECC engine 240. For clarity, it is assumed that the L2 segment to be updated is S1 of FIG. 3B and the sub segment including the logical addresses LBA that the physical addresses PBA are to be changed is SS2 of FIG. 3B. For simplification, only partial elements in the configuration of the nonvolatile memory device 100 of FIG. 2 are illustrated in FIG. 6.

Referring to FIG. 6, the memory interface 250 may generate the map read command MRCMD to be provided to the nonvolatile memory device 100 based on the map read control signal provided from the map update module MUM of FIG. 4B and provide the generated map read command MRCMD to the nonvolatile memory device 100 (operation ①).

The I/O circuit 180 of the nonvolatile memory device 100 may receive the map read command MRCMD provided from the memory interface 250 and provide the map read command MRCMD to the control logic 170. The control logic 170 may control the operations of the row decoder 120 of FIG. 2, the column decoder 140, the voltage generator 160, and the data read/write circuit 130 to read the L2 segment S1 stored in the address map table AMT of the memory cell array 110 and store the read L2 segment S1 in the page buffer 150, in response to the map read command MRCMD (operation ②). The control logic 170 may control the page buffer 150 to output the L2 segment S1 and control the I/O circuit 180 to transmit the L2 segment S1 output from the page buffer 150 to the memory interface 250 (operation ③).

The memory interface 250 may transmit the L2 segment S1 received from the nonvolatile memory device 100 to the ECC engine 240 (operation ④). The I/O circuit 241 of the ECC engine 240 may receive the L2 segment S1 and output the L2 segment S1 to be stored in the ECC memory 242 (operation ⑤).

Figure 7A:
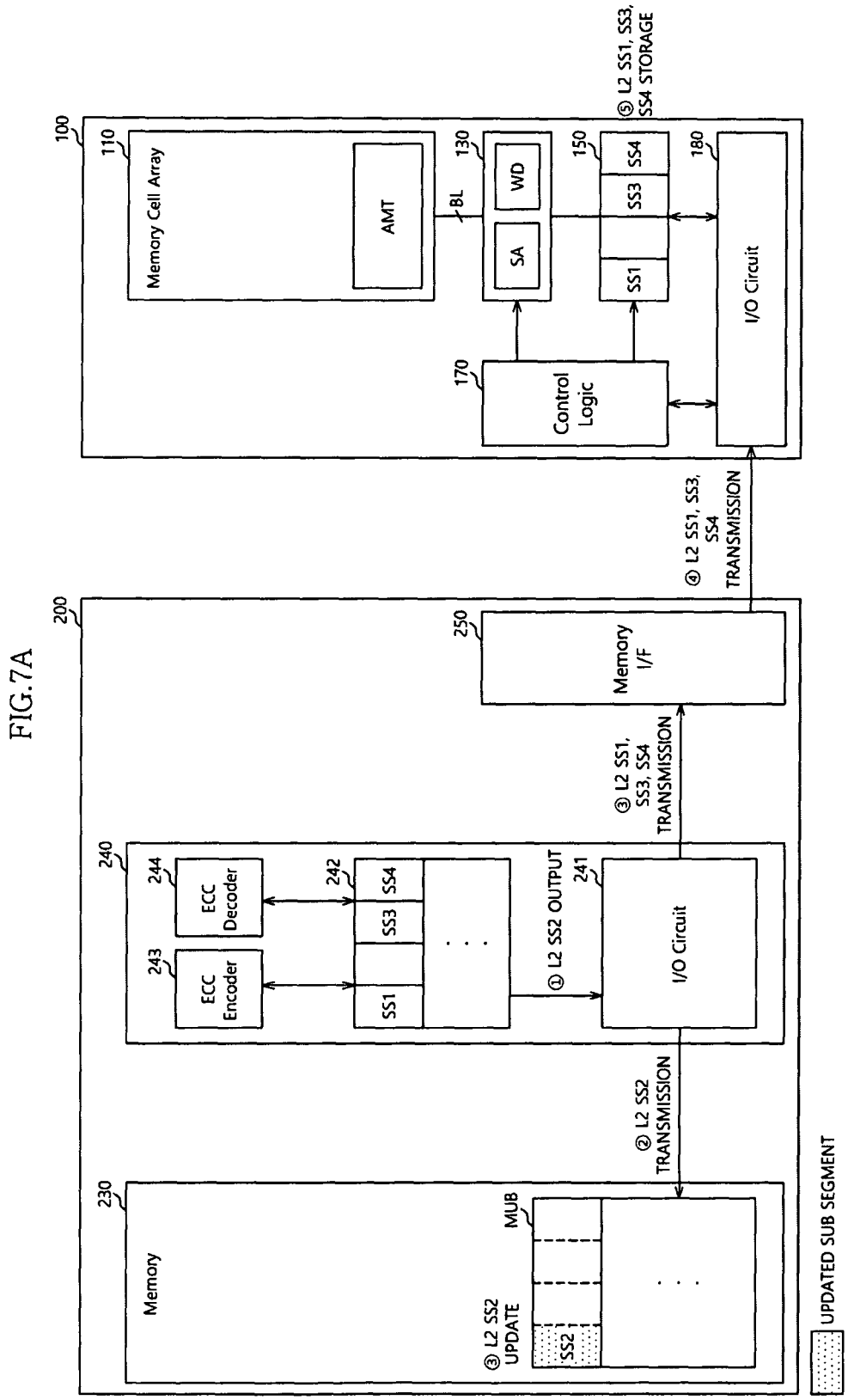
FIGS. 7A and 7B are diagrams illustrating a process of a map updating operation according to an embodiment of the present disclosure.
Figure 7B:
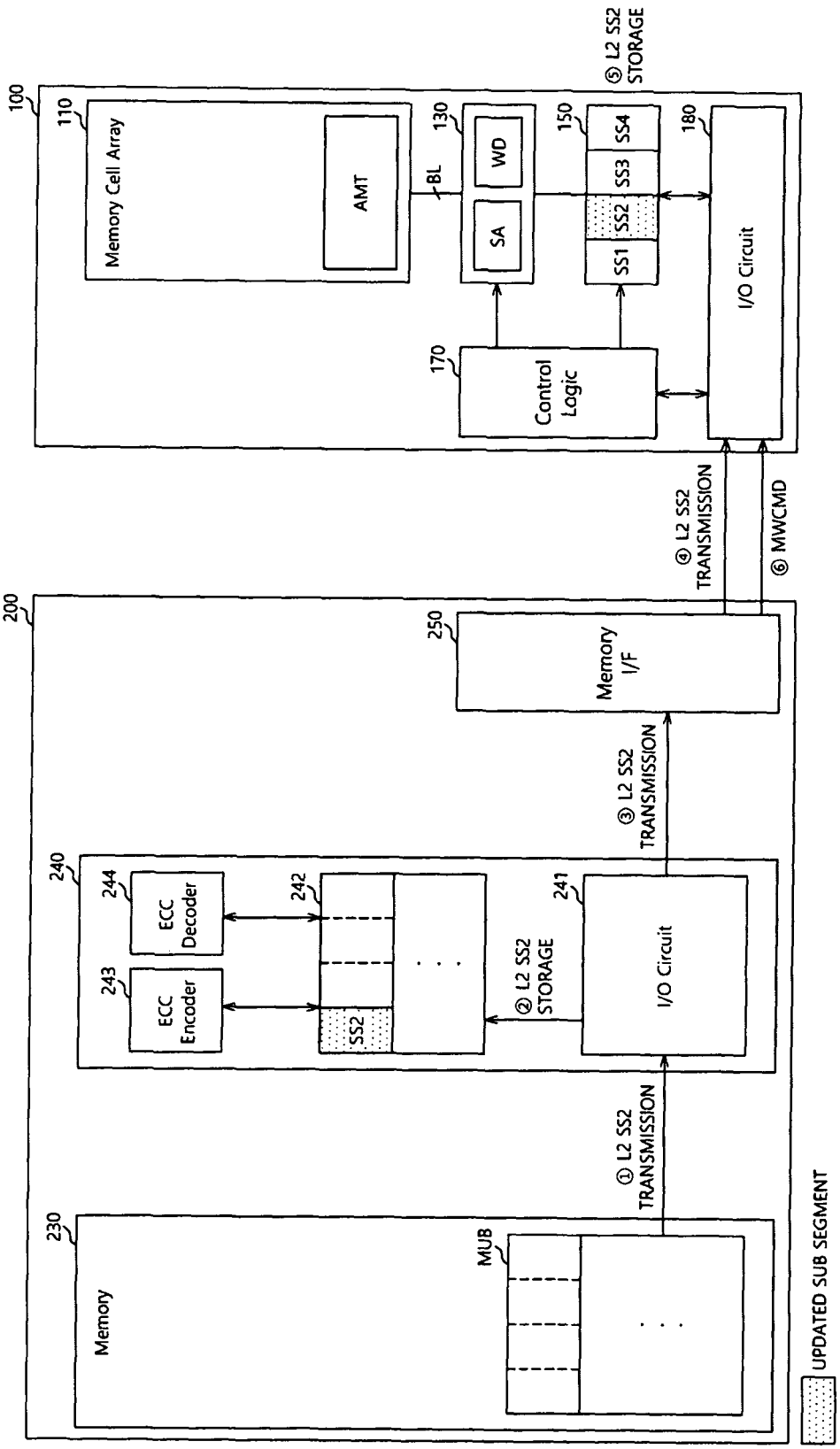

FIGS. 7A and 7B are diagrams illustrating a process of a map update operation according to an embodiment. Specifically, FIG. 7A is a diagram illustrating an example of a process of updating the sub segment SS2 that needs to be updated by loading the sub segment SS2 that needs to be updated among the sub segments of the L2 segment into the map update buffer MUB, and encoding remaining sub segments SS1, SS3, and SS4 and storing the encoded remaining sub segments SS1, SS3, and SS4 in the page buffer 150 of the nonvolatile memory device 100. FIG. 7B is a diagram illustrating a process example of encoding the updated sub segment SS2 and storing the encoded and updated sub segment SS2 in the page buffer 150 of the nonvolatile memory device 100 and storing the L2 segment S1 stored in the page buffer 150 in the memory cell array.

Although not shown in FIG. 7A, the ECC control circuit 245 of the ECC engine 240 in FIG. 5 may control the ECC decoder 244 to perform a decoding operation on the sub segments SS1 to SS4 of the L2 segment S1 stored in the ECC memory 242 according to the map data decoding control signal provided from the map update module MUM. For clarity, it is assumed that all the decoding results for the sub segments SS1 to SS4 are 'PASS', that is, successful. The decoded sub segments SS1 to SS4 may be stored in the ECC memory 242 again.

Referring to FIG. 7A, the ECC control circuit 245 may control the ECC memory 242 to output the sub segment SS2 to be updated among the sub segments SS1 to SS4 of the L2 segment S1 according to the first map data load control signal provided from the map update module MUM (operation ①). The ECC control circuit 245 may control the I/O circuit 241 to transmit the sub segment SS2 output from the ECC memory 242 to the map update buffer MUB of the memory 230 (operation ②).

The updating for the sub segment SS2 loaded into the map update buffer MUB may be performed through control of the map update module MUM (operation ③). Simultaneously, the ECC control circuit 245 may control the ECC encoder 243 and the I/O circuit 241 to perform encoding on the remaining sub segments SS1, SS3, and SS4 of the L2 segment S1 stored in the ECC memory 242 and then transmit the encoded sub segments SS1, SS3, and SS4 to the memory interface 250 based on the second map data encoding control signal and the second map data transfer control signal provided from the map update module MUM (operation ③).

The memory interface 250 may transmit the received encoded sub segments SS1, SS3, and SS4 to the nonvolatile memory device 100 (operation ④). The I/O circuit 180 of the nonvolatile memory device 100 may receive the encoded sub segments SS1, SS3, and SS4 from the memory interface 250 and output the sub segments SS1, SS3, and SS4 to be stored in the page buffer 150 (operation ⑤). The encoded sub segments SS1, SS3, and SS4 may be stored in corresponding positions in the page buffer 150. Accordingly, a position in which the sub segment SS2 to be updating is to be stored in the page buffer 150 may be in an empty state. While the sub segments SS1, SS3, and SS4 as a non-updating target are encoded and stored in the page buffer 150, the updating for the sub segments SS2 loaded into the map update buffer MUB may be completed.

Referring to FIG. 7B, the updated sub segment SS2 may be transmitted to the ECC engine 240 through control of the map update module MUM (operation ①). The I/O circuit 241 of the ECC engine 240 may receive the updated sub segment SS2 and output the updated sub segment SS2 to be stored in the ECC memory 242 (operation ②).

The ECC control circuit 245 may control the ECC encoder 243 and the I/O circuit 241 to perform encoding on the updated sub segment SS2 stored in the ECC memory 242 and transmit the encoded sub segment SS2 to the memory interface 250, according to the first map data encoding control signal and the first map data transfer control signal provided from the map update module MUM (operation ③).

The memory interface 250 may transmit the encoded sub segment SS2 to the nonvolatile memory device 100 (operation ④). The I/O circuit 180 of the nonvolatile memory device 100 may receive the encoded sub segment SS2 from the memory interface 250 and output the encoded sub segment SS2 to be stored in the corresponding position of the page buffer 150 (operation ⑤).

The page buffer 150 of the nonvolatile memory device 100 may be in a state that all the updated sub segment SS2 and the non-updated remaining sub segments SS1, SS3, and SS4 are stored. The memory interface 250 may generate the map write command MWCMD to be provided to the nonvolatile memory device 100 based on the map write control signal provided from the map update module MUM and provide the generated map write command MWCMD to the nonvolatile memory device 100 (operation ⑥).

The I/O circuit 180 of the nonvolatile memory device 100 may receive the map write command MWCMD from the memory interface 250 and provide the received map write command MWCMD to the control logic 170. The control logic 170 may control the operations of the row decoder 120, the column decoder 140, the voltage generator 160, and the data read/write circuit 130 to store the updated L2 segment S1, which is stored in the page buffer 150, in the address map table AMT of the memory cell array 110 in response to the map write command MWCMD.

Figure 8B:
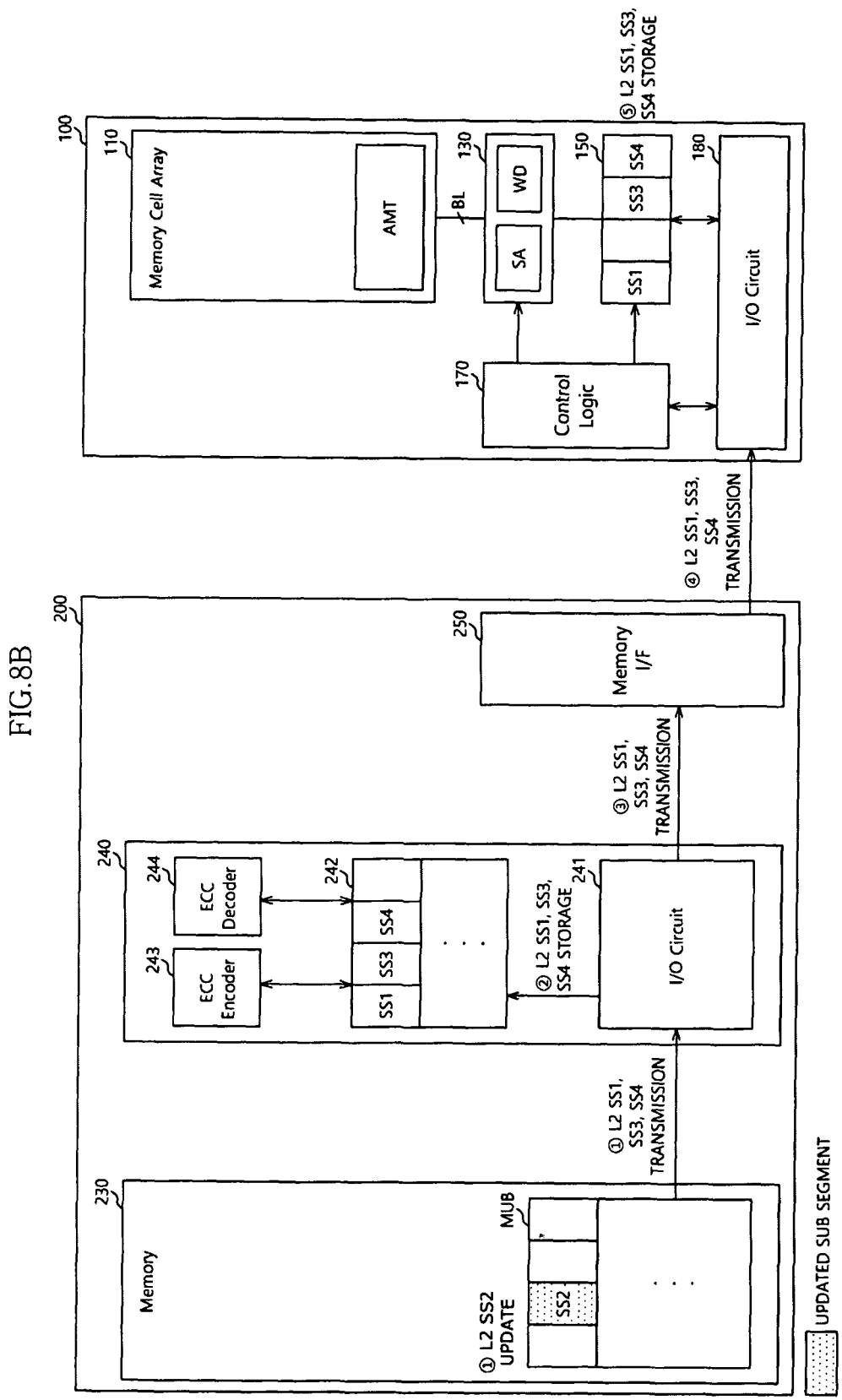
Figure 8C:
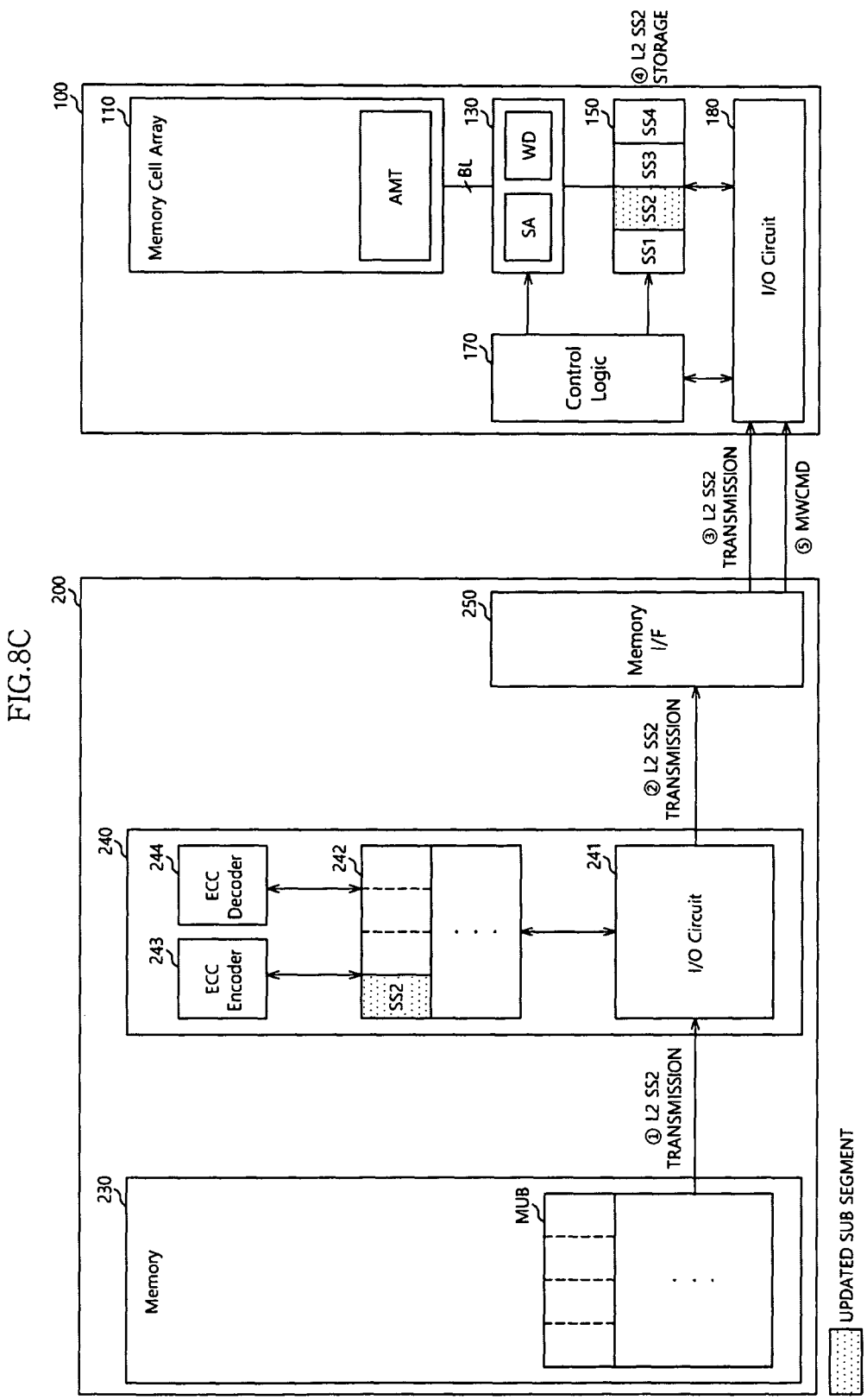

FIGS. 8A to 8C are diagrams illustrating a process of a map updating operation according to an embodiment. Specifically, FIG. 8A is a diagram illustrating an example of a process of loading all the sub segments SS1 to SS4 of the L2 segment into the map update buffer MUB. FIG. 8B is a diagram illustrating an example of a process of performing updating on the sub segment SS2 to be updated, and simultaneously encoding the remaining sub segments SS1, SS3, and SS4 and storing the encoded remaining sub segments SS1, SS3, and SS4 in the page buffer 150 of the nonvolatile memory device 100. FIG. 8C is a diagram illustrating a process example of encoding the updated sub segment SS2 and storing the encoded and updated sub segment SS2 in the page buffer 150 of the nonvolatile memory device 100, and storing the L2 segment S1, which is stored in the page buffer 150, in the memory cell array.

Although not shown in FIG. 8A, the ECC control circuit 245 of the ECC engine 240 may control the ECC decoder 244 to perform a decoding operation on the sub segments SS1 to SS4 of the L2 segment S1 stored in the ECC memory 242 according to the map data decoding control signal provided from the map update module MUM.

Referring to FIG. 8A, the ECC control circuit 245 may control the ECC memory 242 to output all the sub segments SS1 to SS4 of the L2 segment S1 according to the second map data load control signal provided from the map update module MUM (operation ①). The ECC control circuit 245 may control the I/O circuit 241 to transmit the sub segments SS1 to SS4 of the L2 segment S1 output from the ECC memory 242 to the map update buffer MUB of the memory 230 (operation ②).

Referring to FIG. 8B, the sub segments SS1, SS3, and SS4 as a non-updating target among the sub segments SS1 to SS4 of the L2 segment S1 loaded into the map update buffer MUB may be transmitted to the ECC engine 240 again and the map updating on the sub segment SS2 to be updated, which remains in the map update buffer MUB, may be performed (operation ①), through control of the map update module MUM. The I/O circuit 241 of the ECC engine 240 may receive the sub segments SS1, SS3, and SS4 from the memory 230 and output the sub segments SS1, SS3, and SS4 to be stored in the ECC memory 242 (operation ②).

The ECC control circuit 245 may control the ECC encoder 243 and the I/O circuit 241 to perform encoding on the sub segments SS1, SS3, and SS4 of the L2 segment S1 stored in the ECC memory 242. Then, the ECC control circuit 245 may transmit the encoded sub segments SS1, SS3, and SS4 to the memory interface 250 based on the second map data encoding control signal and the second map data transfer control signal provided from the map update module MUM (operation ③).

The memory interface 250 may transmit the received encoded sub segments SS1, SS3, and SS4 to the nonvolatile memory device 100 (operation ④). The I/O circuit 180 of the nonvolatile memory device 100 may receive the encoded sub segments SS1, SS3, and SS4 from the memory interface 250 and output the received encoded sub segments SS1, SS3, and SS4 to be stored in the page buffer 150 (operation ⑤). The encoded sub segments SS1, SS3, and SS4 may be stored in corresponding positions of the page buffer 150.

Referring to FIG. 8C, the updated sub segment SS2 may be transmitted to the ECC engine 240 through control of the map update module MUM (operation ①). The I/O circuit 241 of the ECC engine 240 may receive the updated sub segment SS2 and output the received updated sub segment SS2 to be stored in the ECC memory 242.

The ECC control circuit 245 may control the ECC encoder 243 and the I/O circuit 241 to perform encoding on the updated sub segment SS2 stored in the ECC memory 242, and transmit the encoded sub segment SS2 to the memory interface 250, according to the first map data encoding control signal and the first map data transfer control signal provided from the map update module MUM (operation ②).

The memory interface 250 may transmit the encoded sub segment SS2 to the nonvolatile memory device 100 (operation ③). The I/O circuit 180 of the nonvolatile memory device 100 may receive the encoded sub segment SS2 from the memory interface 250 and output the received encoded sub segment SS2 to be stored in a corresponding position of the page buffer 150 (operation ④).

The memory interface 250 may generate the map write command MWCMD to be provided to the nonvolatile memory device 100 based on the map write control signal provided from the map update module MUM and provide the generated map write command MWCMD to the nonvolatile memory device 100 (operation ⑤).

FIG. 9 is a flowchart illustrating an operating method of the data storage device according to an embodiment. Specifically, FIG. 9 is a flowchart illustrating a map updating method of the data storage device according to an embodiment. The operating method of a data storage device according to an embodiment shown in FIG. 9 will be described with references FIGS. 1 to 8C.

In operation S901, the L2 segment (for example, S1 of FIG. 6) to be updated among the plurality of L2 segments S1 to Sn of FIG. 3A stored in the address map table (AMT) of the nonvolatile memory device 100 of FIG. 1 may be read from the nonvolatile memory device 100 and decoded.

The reading of the L2 segment S1 to be updated from the nonvolatile memory device 100 may be performed through the map update module MUM of FIG. 4A driven through the processor 220 of FIG. 1. For example, the map update module MUM may provide the map read control signal, which instructs the L2 segment S1 to be updated to be read, to the memory interface 250 of FIG. 1. The memory interface 250 may generate the map read command MRCMD of FIG. 6 to be provided to the nonvolatile memory device 100 based on the map read control signal and provide the generated map read command MRWMD to the nonvolatile memory device 100.

The control logic 170 of the nonvolatile memory device 100 of FIG. 2 may control the nonvolatile memory device 100 to read the L2 segment S1 to be updated, which is stored in the address map table AMT of the memory cell array 110 of FIG. 2, and transmit the read L2 segment S1 to be updated to the memory interface 250, in response to the map read command MRCMD.

The memory interface 250 may provide the L2 segment S1 received from the nonvolatile memory device 100 to the ECC engine 240 of FIG. 5. The ECC control circuit 245 of the ECC engine 240 of FIG. 5 may control the ECC decoder 244 to perform decoding on the L2 segment S1 according to the map data decoding control signal provided from the map update module MUM.

In operation S903, the ECC control circuit 245 of the ECC engine 240 may determine whether the first map data load control signal or the second map data load control signal is provided from the map update module MUM. When the first map data load control signal is provided (i.e. Case A), the process may proceed to operation S905. When the second map data load control signal is provided (i.e. Case B), the process may proceed to operation S909.

In operation S905, the ECC control circuit 245 of the ECC engine 240 may control the ECC engine 240 to load the first sub segment (for example, SS2 of FIG. 7A) as an updating target among the plurality of sub segments SS1 to SS4 included in the decoded L2 segment S1 to the map update buffer MUB of the memory 230. The map updating on the first sub segment SS2 loaded into the map update buffer MUB may be performed through control of the map update module MUM.

In operation S907, the ECC control circuit 245 of the ECC engine 240 may control the ECC encoder 243 to perform encoding on the second sub segments SS1, SS3, and SS4 as a non-updating target stored in the ECC memory 242 within the ECC engine 240, and control the I/O circuit 241 to transmit the encoded second sub segments SS1, SS3, and SS4 to the memory interface 250, according to the second map data encoding control signal and the second map data transfer control signal provided from the map update module MUM.

The memory interface 250 may receive the encoded second sub segments SS1, SS3, and SS4 from the ECC engine 240, and transmit the received encoded second sub segments SS1, SS3, and SS4 to the nonvolatile memory device 100. The I/O circuit 180 of the nonvolatile memory device 100 may receive the encoded second sub segments SS1, SS3, and SS4 from the memory interface 250, and output the received encoded second sub segments SS1, SS3, and SS4 to be stored in corresponding positions of the page buffer 150.

In operation S909, the ECC control circuit 245 of the ECC engine 240 may control the ECC engine 240 to load all the plurality of sub segments SS1 to SS4 included in the decoded L2 segment S1 into the map update buffer MUB of the memory 230.

In operation S911, the remaining second sub segments SS1, SS3, and SS4 other than the first sub segment SS2 as an updating target among the plurality of sub segments SS1 to SS4 loaded into the map update buffer MUB may be transmitted to the ECC engine 240 through control of the map update module MUM.

In operation S913, the updating on the first sub segment SS2 remaining in the map update buffer MUB may be performed through control of the map update module MUM. The ECC control circuit 245 of the ECC engine 240 may control the ECC encoder 243 to perform encoding on the second sub segments SS1, SS3, and SS4 received from the memory 230 and control the I/O circuit 241 to transmit the encoded second sub segments SS1, SS3, and SS4 to the memory interface 250, according to the second map data encoding control signal and the second map data transfer control signal provided from the map update module MUM.

After performing the operations S907 or S913, the operation S915 may be performed. In operation S915, the update-completed first sub segment SS2 may be transmitted to the ECC engine 240 from the map update buffer MUB through control of the map update module MUM. The ECC control circuit 245 may control the ECC encoder 243 to perform encoding on the updated first sub segment SS2 received from the memory 230 and control the I/O control circuit 241 to transmit the encoded first sub segment SS2 to the memory interface 250, according to the first map data encoding control signal and the first map data transfer control signal provided from the map update module MUM.

In operation 5917, the map update module MUM may provide the map write control signal, which instructs the updated L2 segment S1 to be written, to the memory interface 250. The memory interface 250 may generate the map write command MWCMD to be provided to the nonvolatile memory device 100 based on the map write control signal, and provide the generated map write command MWCMD to the nonvolatile memory device 100.

The control logic 170 of the nonvolatile memory device 100 may control the nonvolatile memory device 100 to store the updated L2 segment S1, which is stored in the page buffer 150, in the address map table AMT of the memory cell array 110 in response to the map write command MWCMD.

Figure 10:
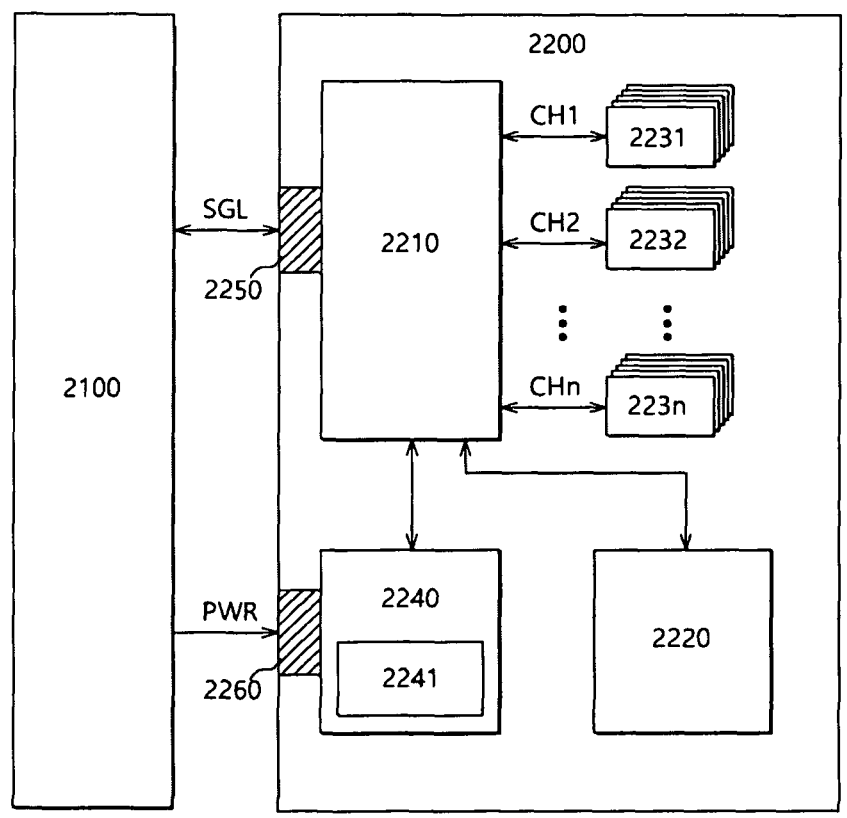
FIG. 10 is a diagram illustrating a data processing system including a solid state drive (SSD) according to an embodiment of the present disclosure.

FIG. 10 is a diagram illustrating a data processing system 2000 according to an embodiment. Referring to FIG. 10, the data processing system 2000 may include a host device 2100 and a solid state drive (SSD) 2200.

The SSD 2200 may include a controller 2210, a buffer memory device 2220, nonvolatile memory devices 2231 to 223$n$, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223$n$. The buffer memory device 2220 may temporarily store data read from the nonvolatile memory devices 2231 to 223$n$. The data temporarily stored in the buffer memory device 2220 may be transmitted to the host device 2100 or the nonvolatile memory devices 2231 to 223$n$ according to control of the controller 2210.

The nonvolatile memory devices 2231 to 223$n$ may be used as a storage medium of the SSD 2200. The nonvolatile memory devices 2231 to 223$n$ may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include at least one capacitor having large capacity capable of charging the power PWR.

The controller 2210 may exchange a signal SGL with the host device 2100 through the signal connector 2250. The signal SGL may include a command, an address, data, and the like. The signal connector 2250 may be configured of various types of connectors according to an interfacing method between the host device 2100 and the SSD 2200.

Figure 11:
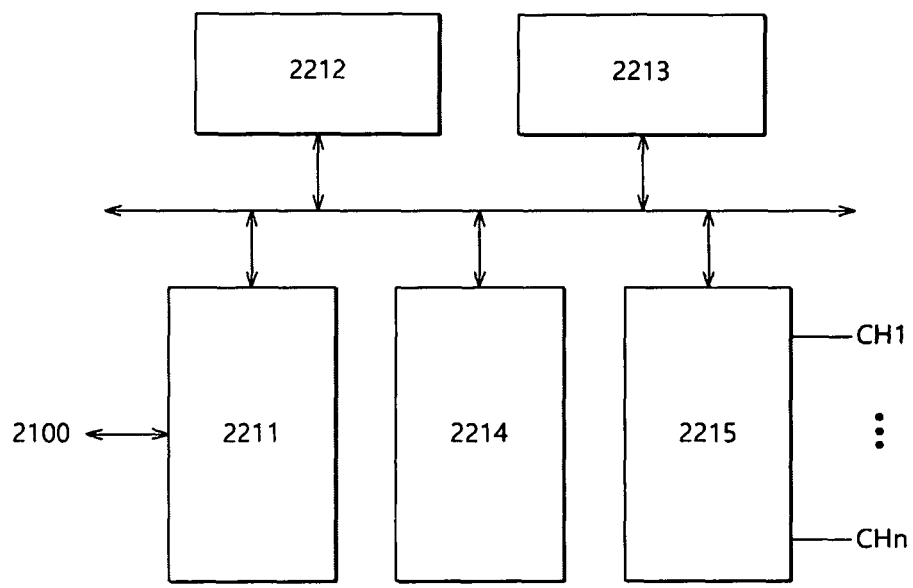
FIG. 11 is a diagram illustrating a controller according to an embodiment of the present disclosure.

FIG. 11 is a diagram illustrating the controller 2210 of FIG. 10. Referring to FIG. 11, the controller 2210 may include a host interface unit 2211, a control unit 2212, a random access memory (RAM) 2213, an error correction code (ECC) unit 2214, and a memory interface unit 2215.

The host interface unit 2211 may perform interfacing between the host device 2100 and the SSD 2200 according to a protocol of the host device 2100. For example, the host interface unit 2211 may communicate with the host device 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-e or PCIe) protocol, and a universal flash storage (UFS) protocol. The host interface unit 2211 may perform a disc emulation function that the host device 2100 recognizes the SSD 2200 as a general-purpose data storage device, for example, a hard disc drive HDD.

The control unit 2212 may analyze and process the signal SGL input from the host device 2100. The control unit 2212 may control operations of internal functional blocks according to firmware and/or software for driving the SSD 2200. The RAM 2213 may operate as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 12:
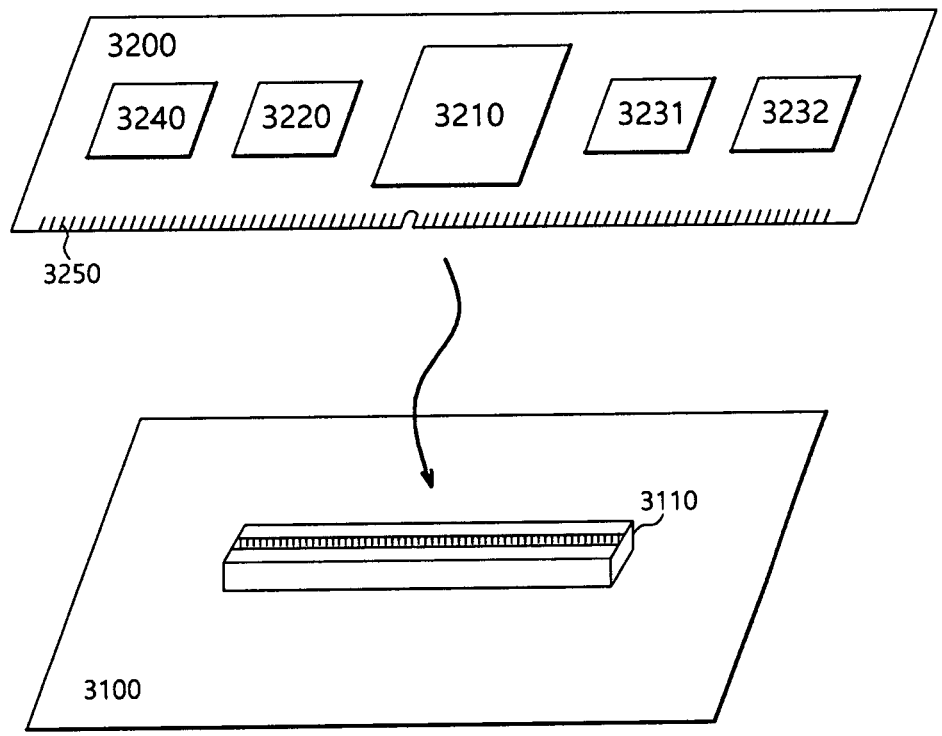
FIG. 12 is a diagram illustrating a data processing system including a data storage device according to an embodiment of the present disclosure.

FIG. 12 is a diagram illustrating a data processing system 3000 according to an embodiment. Referring to FIG. 12, the data processing system 3000 may include a host device 3100 and a data storage device 3200.

The host device 3100 may be configured in a board form such as a printed circuit board (PCB). Although not shown in FIG. 12, the host device 3100 may include internal functional blocks configured to perform functions of the host device 3100.

The host device 3100 may include a connection terminal 3110 such as a socket, a slot, or a connector. The data storage device 3200 may be mounted on the connection terminal 3110.

The data storage device 3200 may be configured in a board form such as a PCB. The data storage device 3200 may refer to a memory module or a memory card. The data storage device 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage device 3200. The controller 3210 may be configured to have the same configuration as the controller 2210 illustrated in FIG. 11.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as a storage medium of the data storage device 3200.

The PMIC 3240 may provide power input through the connection terminal 3250 to the inside of the data storage device 3200. The PMIC 3240 may manage the power of the data storage device 3200 according to control of the controller 3210.

The connection terminal 3250 may be coupled to the connection terminal 3110 of the host device 3100. A signal such as a command, an address, and data and power may be transmitted between the host device 3100 and the data storage device 3200 through the connection terminal 3250. The connection terminal 3250 may be configured in various forms according to an interfacing method between the host device 3100 and the data storage device 3200. The connection terminal 3250 may be arranged in any one side of the data storage device 3200.

Figure 13:
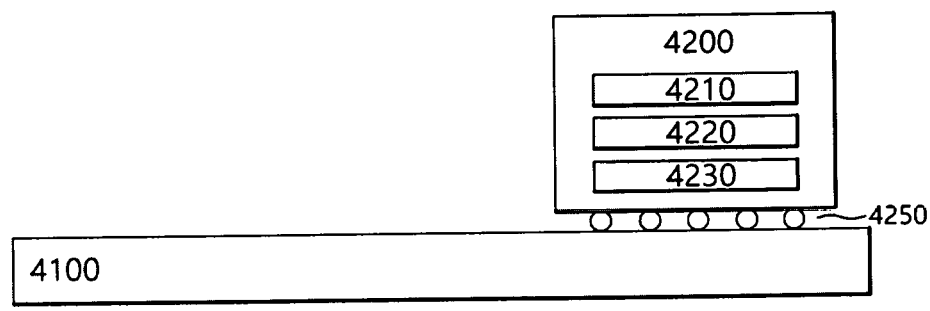
FIG. 13 is a diagram illustrating a data processing system including a data storage device according to an embodiment of the present disclosure.

FIG. 13 is a diagram illustrating a data processing system 4000 according to an embodiment. Referring to FIG. 13, the data processing system 4000 may include a host device 4100 and a data storage device 4200.

The host device 4100 may be configured in a board form such as a printed circuit board (PCB). Although not shown in FIG. 13, the host device 4100 may include internal functional blocks configured to perform functions of the host device 4100.

The data storage device 4200 may be configured in a surface mounting packaging form. The data storage device 4200 may be mounted on the host device 4100 through a solder ball 4250. The data storage device 4200 may include a controller 4210, a buffer memory device 4220, and a nonvolatile memory device 4230.

The controller 4210 may control an overall operation of the data storage device 4200. The controller 4210 may be configured to have the same configuration as the controller 2210 illustrated in FIG. 11.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host device 4100 or the nonvolatile memory device 4230 through control of the controller 4210.

The nonvolatile memory device 4230 may be used as a storage medium of the data storage device 4200.

Figure 14:
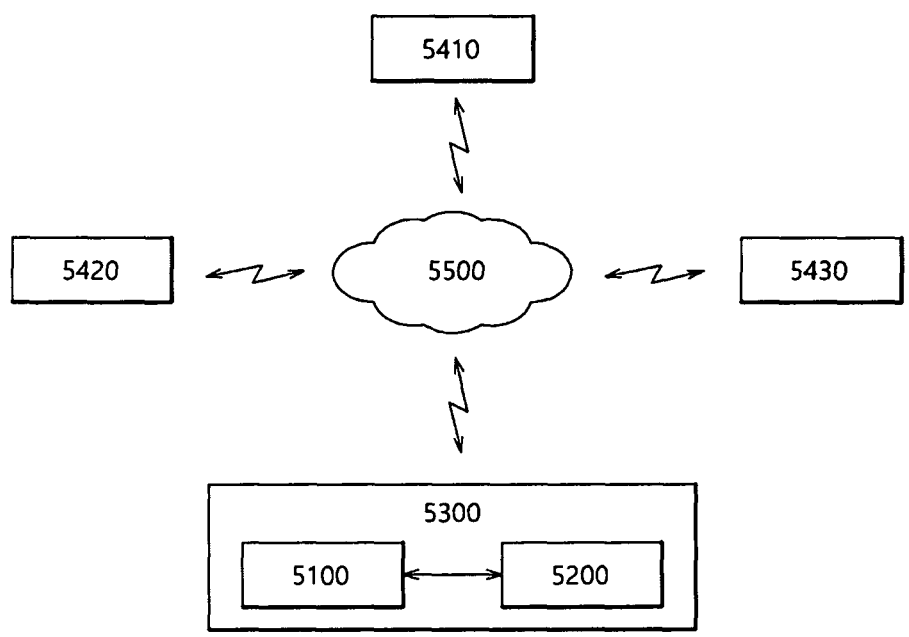
FIG. 14 is a diagram illustrating a network system including a data storage device according to an embodiment of the present disclosure.

FIG. 14 is a diagram illustrating a network system 5000 according to an embodiment. Referring to FIG. 14, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host device 5100 and a data storage device 5200. The data storage device 5200 may be configured of the data storage device 10 of FIG. 1, the data storage device 2200 of FIG. 10, the data storage device 3200 of FIG. 12, or the data storage device 4200 of FIG. 13.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage device comprising:
   a nonvolatile memory device including an address map table in which a plurality of map segments including a plurality of logical-to-physical (P2L) entries are stored; and
   a controller configured to control the nonvolatile memory device,
   wherein the controller includes:
   a processor configured to control an overall operation of the data storage device; and
   a memory configured to store a map update module configured to be driven through the processor and perform map updating on the plurality of map segments,
   wherein the map update module;
   divides each of the map segments into a plurality of sub segments,
   updates a first sub segment as an updating target among the plurality of sub segments by loading the first sub segment into a map update buffer of the memory, and
   encodes second sub segments as a non-updating target among the plurality of sub segments and stores the encoded second sub segments in a page buffer of the nonvolatile memory device.

2. The data storage device of claim 1, wherein the controller further includes:
   a memory interface configured to read a map segment to be updated from the nonvolatile memory device and transmit an updated map segment to the nonvolatile memory device, according to control of the map update module; and
   an error correction code (ECC) engine configured to decode the map segment to be updated and transmit all or a portion of the plurality of sub segments included in the decoded map segment to the map update buffer, and encode the updated sub segment or non-updated sub segments and transmit the encoded sub segments to the memory interface, according to control of the map update module.

3. The data storage device of claim 2, wherein the map update module provides a map read control signal which instructs the map segment to be updated to be read and a map write control signal which instructs the updated map segment to be stored in the nonvolatile memory device to the memory interface.

4. The data storage device of claim 3, wherein the memory interface generates a map read command to be provided to the nonvolatile memory device and transmits the map read command to the nonvolatile memory device according to the map read control signal provided from the map update module, and generates a map write command to be provided to the nonvolatile memory device and transmits the map write command to the nonvolatile memory device according to the map write control signal provided from the map update module.

5. The data storage device of claim 2, wherein the ECC engine includes:
   an input/output (I/O) circuit configured to perform input and output with respect to the memory and the memory interface;
   an ECC encoder configured to encode the updated first sub segment and the second sub segments;
   an ECC decoder configured to decode the map segment to be updated;
   an ECC memory configured to temporarily store the map segment to be updated, the decoded map segment, and the encoded first sub segment and second sub segments; and
   an ECC control circuit configured to control an overall operation of the ECC engine.

6. The data storage device of claim 5, wherein the map update module provides, to the ECC engine, a first map data load control signal which instructs the first sub segment to be loaded into the map update buffer; a second map data load control signal which instructs all the plurality of sub segments included in the decoded map segment to be loaded into the map update buffer; a first map data encoding control signal which instructs the updated first sub segment to be encoded; a second map data encoding control signal which instructs the second sub segments to be encoded; a first map data transfer control signal which instructs the encoded first sub segment to be transmitted to the memory interface; and a second map data transfer control signal which instructs the second sub segments to be transmitted to the memory interface.

7. The data storage device of claim 6, wherein when the first map data load control signal is provided from the map update module, the ECC control circuit controls the ECC memory and the I/O circuit to output only the first sub segment in the decoded map segment stored in the ECC memory and transmit the first sub segment to the map update buffer.

8. The data storage device of claim 6, wherein when the second map data load control signal is provided from the map update module, the ECC control circuit controls the ECC memory and the I/O circuit to output all the sub segments of the decoded map segment stored in the ECC memory and transmit the sub segments to the map update buffer.

9. The data storage device of claim 8, wherein the map update module transmits the second sub segments stored in the map update buffer to the ECC engine again and controls updating on the first sub segment remaining in the map update buffer to be performed.

10. The data storage device of claim 6, wherein when the first map data encoding control signal and the first map data transfer control signal are provided from the map update module, the ECC control circuit controls the ECC encoder and the I/O circuit to encode the updated first sub segment and transmit the encoded updated first sub segment to the memory interface.

11. The data storage device of claim 6, wherein when the second map data encoding control signal and the second map data transfer control signal are provided from the map update module, the ECC control circuit controls the ECC encoder and the I/O circuit to encode the second sub segments and transmit the encoded second sub segments to the memory interface.

12. An operating method of a data storage device which includes a nonvolatile memory device having an address map table in which a plurality of map segments including a plurality of logical-to-physical (L2P) entries are stored and a controller configured to control the nonvolatile memory device, the method comprising:

decoding a map segment to be updated by reading the map segment to be updated among the plurality of map segments from the nonvolatile memory device;

performing updating on a first sub segment as an updating target among a plurality of sub segments included in the decoded map segment to be updated; and encoding second sub segments as a non-updating target among the plurality of sub segments and storing the encoded second sub segments in a page buffer of the nonvolatile memory device.

13. The method of claim 12, wherein the performing of the updating on the first sub segment includes:

loading only the first sub segment among the plurality of sub segments into a map update buffer; and performing updating on the first sub segment loaded into the map update buffer.

14. The method of claim 13, further comprising, after the performing of the updating on the first sub segment, encoding the updated first sub segment and storing the encoded and updated first sub segment in the page buffer of the nonvolatile memory device.

15. The method of claim 14, further comprising, after the storing of the encoded and updated first sub segment in the page buffer, storing the updated map segment, which is stored in the page buffer, in the address map table of the nonvolatile memory device.

16. The method of claim 12, wherein the performing of the updating on the first sub segment includes:

loading all the plurality of sub segments into a map update buffer;

transmitting the second sub segments other than the first sub segment in the map update buffer to an error correction code (ECC) engine of the controller; and performing updating on the first sub segment remaining in the map update buffer.

17. The method of claim 16, further comprising, after the performing of the updating on the first sub segment, encoding the updated first sub segment;

storing the encoded and updated first sub segment in the page buffer of the nonvolatile memory device; and storing the updated map segment, which is stored in the page buffer, in the address map table of the nonvolatile memory device.

18. A data storage device comprising:

a nonvolatile memory device including an address map table storing a plurality of map segments, each of the map segments including a plurality of map entries; and a controller including a processor and a map update module configured to be driven by the processor, wherein the map update module:

determines whether at least one map entry among the plurality of map entries is required to update;

when it is determined that the at least one map entry is required to update, updates a target sub segment included in a target segment among the plurality of map segments, each of the map segments including a plurality of sub segments, each of the sub segments including multiple map entries, the target sub segment among the plurality of sub segments and the target segment including the at least one map entry;

encodes remaining sub segments included in the target segment excluding the target sub segment; and stores the updated target sub segment and the encoded remaining sub segments in the nonvolatile memory device.

19. The data storage device of claim 18, wherein the controller is further configured to read the target segment from the address map table.

20. The data storage device of claim 18, wherein each of the plurality of sub segments corresponds to a unit of error correction code (ECC) coding.

* * * * *